United States Patent
Cirot et al.

[19]

[11] Patent Number: 5,889,421
[45] Date of Patent: Mar. 30, 1999

[54] DEVICE FOR DETECTING THE LOCKING OF AN AUTOMATIC GAIN CONTROL CIRCUIT

[75] Inventors: Eric Cirot, Fontaine; Nicolas Lebouleux, Grenoble, both of France

[73] Assignee: SGS-Thomson Microelectronics S.A., Saint Genis, France

[21] Appl. No.: 922,612

[22] Filed: Sep. 3, 1997

[30] Foreign Application Priority Data

Sep. 9, 1996 [FR] France ................................. 96 11219

[51] Int. Cl.⁶ ........................................... H03L 7/00
[52] U.S. Cl. ...................... 327/141; 327/310; 348/528
[58] Field of Search ........................... 327/96, 97, 141, 327/142, 310, 63, 64; 330/DIG. 2; 348/500, 505, 528–537, 544–545

[56] References Cited

U.S. PATENT DOCUMENTS

| | | | |
|---|---|---|---|
| 4,361,785 | 11/1982 | Stapleton | 315/389 |
| 4,992,707 | 2/1991 | Arai et al. | 315/403 |
| 4,999,549 | 3/1991 | Wilber | 315/387 |
| 5,111,119 | 5/1992 | Truskalo et al. | 315/386 |
| 5,250,879 | 10/1993 | Koblitz | 315/403 |
| 5,703,656 | 12/1997 | Shreve et al. | 348/549 |
| 5,783,956 | 7/1998 | Ooishi | 327/157 |
| 5,815,016 | 9/1998 | Erickson | 327/158 |

OTHER PUBLICATIONS

French Search Report from French Patent Application 96 11219, filed Sep. 9, 1996.

*Primary Examiner*—My-Trang Nu Ton
*Attorney, Agent, or Firm*—Wolf, Greenfield & Sacks, P.C.

[57] ABSTRACT

The present invention relates to a device for detecting the locking of an automatic gain control circuit, the automatic gain control circuit receiving a signal to be regulated, a check signal and a sampling control signal for driving the operation of the circuit. The detection device includes a comparator receiving the check signal and the signal to be regulated or a signal representative of the signal to be regulated. The comparator generates two logic signals, the states of which form a specific combination of logic states when the value of the signal to be regulated is in a range of values including the value of the check signal. A logic comparator circuit generates a logic comparison signal, the state of which is representative of the presence or absence of this specific combination, and a storage means, driven by the sampling control signal, stores the state of the signal provided by the logic circuit.

42 Claims, 2 Drawing Sheets

DEVICE FOR DETECTING THE LOCKING OF AN AUTOMATIC GAIN CONTROL CIRCUIT

BACKGROUND OF THE INVENTION

1. Field of the Invention

The present invention relates to a device for detecting the locking of an automatic gain control circuit. It applies, for example, to the field of the processing of synchronization signals applied to on-screen display.

2. Discussion of the Related Art

To control the display of images on a cathode-ray tube of a monitor or of a television screen and, more specifically, to control the scanning of an electron beam on a screen, synchronization signals are used. The synchronization signals contain time information enabling determination of the beginning of the lines (horizontal synchronization) and of the frames (vertical synchronization). A frame is the set of lines required to form an image on a screen. The synchronization signals are logic pulse signals mainly defined by the polarity of their pulses (which is positive or negative according to whether the rising edges or the falling edges are taken into account), the recurrence frequency of the pulses, and their duration.

The vertical synchronization signals are transmitted directly, or in a compound signal including both the vertical and horizontal synchronization signals.

A conventional method for controlling the vertical scanning consists in generating, by means of an oscillator, a sawtooth-shaped signal based on the received vertical synchronization pulse signal. If the received signal is a compound signal, a vertical synchronization signal extracted from the compound signal will have been previously provided, this extracted signal being then used to generate the sawtooth-shaped signal. The sawtooth-shaped signal conventionally has the same frequency as the received pulse signal and a fixed amplitude (this latter characteristic being controlled by an automatic gain control loop, or AGC).

FIG. 1 schematically illustrates a circuit 2 for processing a vertical synchronization signal VIN. It includes an input 4 for receiving signal VIN which can be of positive or negative polarity.

The vertical display is always constructed in the same way (from the top of the screen to the bottom), an input interface circuit 6 receives signal VIN and generates from this signal a logic pulse signal SYNC of fixed polarity (for example negative) and having a recurrence frequency identical to that of signal VIN. This signal SYNC is supplied to an oscillator control circuit 8. This circuit 8 controls the charge and the discharge of a capacitor 10 across which a sawtooth-shaped signal VOSC having a constant amplitude is generated. Capacitor 10 is charged with a current IOSC supplied by an automatic gain control loop 12. A switch (in FIG. 1, it is a MOS-type N-channel transistor 14) and a resistor 16, mounted in series, are placed in parallel across capacitor 10. The switch is controlled by circuit 8 so that the capacitor charges when the switch is open, and that it discharges through the switch when the switch is closed.

Signal VOSC is supplied to circuit 8 via an operational amplifier 18 mounted as a follower (the signal supplied by amplifier 18 is referred to as VOUT). Circuit 8 includes a comparator circuit for comparing signal VOUT with a potential VMIN and an edge detector, so that the sawtooth-shaped signal VOSC oscillates between value VMIN and a value corresponding to the occurrence of a type of edge in signal SYNC, for example, the falling edges. Thus, signal VOSC has a frequency corresponding to the frequency of the received synchronization signal. To ensure that signal VOSC has a constant amplitude, the automatic gain control circuit which controls the charge current of capacitor 10 is used, so that the value reached by signal VOSC upon occurrence of the falling edges in signal SYNC corresponds to a check value.

Finally, signal VOUT is supplied to an output stage 20 which will issue a sawtooth-shaped signal CDV. The output stage will, for example, set the gain and the mean value of output signal CDV. The sawtooth-shaped signal CDV is supplied to a circuit which converts it into a current signal, this current signal being issued to the vertical deflectors.

FIG. 2 illustrates an example of implementation of an input interface circuit 6. It is assumed that an output signal SYNC with a negative polarity is provided, whatever the polarity of the signal VIN received. It will further be assumed that signal VIN is at a potential VCC of 5 volts when it is in the high state and at a ground potential GND of 0 volts when it is in the low state, and that signal SYNC is at a potential VH of 8 volts when it is in the high state and at potential GND when it is in the low state. The logic circuits of circuit 6 will be supplied by potentials VCC, VH, and GND.

Circuit 6 includes an input comparator 22 which receives signal VIN on its "−" input and a potential REF1, for example from 2 to 2.5 volts, on its "+" input. This comparator provides a logic signal A. An inverter 24 receives signal A as an input and provides a logic signal B, which is the inverse of signal A.

Signal A controls a switch 26 mounted between the ground and the input of an inverter 28. The switch is open when signal A is in a first state, and it is closed when this signal is in a second state. In the example described, the first state will be the low state and the second state is the high state. A current source 30 providing a current 2I1 and, on the other hand, a capacitor 32, are mounted in parallel to switch 26. A current source 34 is connected to the input of inverter 28. It provides a current I1. Thus, capacitor 32 will be charged or discharged with a constant current, according to whether switch 26 is closed or open. The potential at the input of inverter 28 will be referred to as VC1.

Inverter 28 provides a logic signal D. This signal D is inverted in an inverter 36 and the logic signal generated by inverter 36 is referred to as E. This signal E and signal B are supplied to a two-input NOR-type logic gate 38 which provides a logic signal SET1. Besides, signals D and A are supplied to a two-input NOR-type gate 40 which provides a logic signal SET2.

An RS-type double flip-flop 42 receives signals SET1 and SET2 on its set inputs (referred to as S1 and S2). The flip-flop further receives logic control signals RESET and SECINH on its reset inputs (referred to as R1 and R2). Signal SECINH is, for example, provided by a starting detection circuit so that it switches from a first to a second state when the circuit is supplied. It is here assumed that the first and second states respectively are the low state and the high state. Signal RESET sets the duration of the pulses in signal SYNC. It is typically generated based on the detection of two thresholds on the sawtooth-shaped signal generated by capacitor 10. Flip-flop 42 provides a logic signal F. Signal F is inverted in an inverter 44 which provides a logic signal NF, which is the inverse of signal F. Signal NF is used to control a switch 46 mounted between the ground and a first terminal of a capacitor 48. The second terminal of capacitor 48 is connected to the ground. A current source 50 provides a current I2. It is connected to the first terminal of capacitor 48, so that capacitor 48 is charged or discharged with a constant current according to whether switch 46 is open or closed. The voltage across capacitor 48 will be referred to as VC2. Voltage VC2 is compared to a fixed potential REF2, for example from 6 to 7 volts, in a comparator 52. This comparator provides a logic signal G which is representative of the result of the comparison. This signal is inverted in an inverter 54, which provides a logic signal NG. An inverter 56 inverts signal NG to provide logic signal SYNC. Signals SYNC and F are supplied to a two-input NAND-type logic gate 58 which provides a logic signal NSAMP. This signal is inverted in an inverter 60 which provides a logic signal SAMP which is the inverse of signal NSAMP.

Assume that signal VIN is of positive polarity. The synchronization pulses are characterized by a rising edge subsequently followed by a falling edge. Further assume that signals SAMP, B, D, SET1, SET2, F, and VC2 are in the low state, and that signals SYNC, A, VC1, and G are in the high state.

When the rising edge marking the beginning of a pulse appears, signal A switches to the low state when the switching threshold of comparator 22 is reached. Switch 26 is then open and capacitor 32 discharges with a constant current. Concurrently, signal SET1 switches to the high state. It remains in this high state as long as the switching threshold of inverter 28, which could for example be placed at 4 volts, is not reached and signal E has not changed state. Signal F will thus switch to the high state. Accordingly, capacitor 48 starts charging. Concurrently, signal NSAMP switches to the low state, and signal SAMP switches to the high state. Once threshold REF2 has been reached by signal VC2, signal G (and accordingly, signal SYNC) switches to the low state. This induces signal SAMP to switch back to its original state. Potential REF2 will set the delay during which signal SAMP is in the high state.

When the rising edge marking the end of the synchronization pulse appears, signal A switches back to the high state. Capacitor 32 will thus be charged again. As long as the switching threshold of inverter 28 is not reached, both signals B and E are in the low state. Signal SET2 will thus rise to the high state during this time interval. Once the threshold has been reached, signal E switches to the high state and signal SET2 switches back to the low state. To mark the end of the negative pulse in SYNC, it is enough to provide a rising edge in signal RESET. The signals are then set back to their initial states.

If it is assumed that signal VIN is negatively polarized, a signal SYNC with a negative polarity will be similarly provided. Conversely, the setting signal SYNC to the low state will be controlled by signal SET2 which will mark the beginning of the synchronization pulses.

FIG. 3 illustrates an example of implementation of automatic gain control circuit 12.

It includes an input 62 for receiving the signal VOSC to be regulated, an input 64 for receiving a check signal VREF, an input 66 for receiving logic signal SAMP which controls a sampling, an input 68 for receiving a logic enable control signal NOSYNCHRO and an output 70 for providing current IOSC.

Input 62 is connected to an amplifier 72 mounted as a follower and which provides a signal VOSCA. The "+" input of amplifier 72 is connected to input 62. Its "−" input is connected to its output. Amplifier 72 allows the input impedance of circuit 12 to be controlled so that no current is taken from capacitor 10. The output of amplifier 72 is connected to the "+" input of an amplifier 74. The "−" input of this amplifier 74 is connected on the one hand to input 64 via a resistor 76 and on the other hand to its output, via a resistor 78. The output of amplifier 74 is also connected to a first pole of a capacitor 84, via a resistor 80 and a switch 82 mounted in series. Switch 82 is controlled by signal SAMP. The falling edges of signal SAMP correspond to the falling edges in signal SYNC. The switch will be implemented so as to be closed if signal SAMP is in the high state, and open otherwise. The second pole of capacitor 84 is connected to a ground. The voltage across capacitor 84 is referred to as VSAMP. The first pole of capacitor 84 is further connected to input 64 via a switch 86 controlled by signal NOSYNCHRO, and to the "+" input of an amplifier 88 mounted as a follower. The "−" input of amplifier 88 is connected to its output. Input 64 is connected to the "+" input of an amplifier 92 mounted as a follower. The "−" input of amplifier 92 is connected to its output. The outputs of amplifiers 92 and 88 are interconnected via a resistor 90. A current mirror 94 copies the current I'0 running through this resistor. A current source 96 further provides a reference current I0. Current mirror 94 and current source 96 are connected to output 70, so that this output provides current IOSC by adding currents I0 and I'0.

Let Cosc be the value of capacitor 10.

Cosc.VOSC=IOSC.T with T corresponding to the charging time of capacitor 10, assuming a very fast discharge.

I0 is constant and I'0=(VREF−VSAMP)/R with R being the value of resistor 90.

If the potential provided at the output of amplifier 74 is referred to as V1, the potential on the "−" input of this amplifier is referred to as Vh and the values of resistors 78 and 76 are referred to as R1 and R2, then (V1−Vh)/R1 =(Vh−VREF)/R2.

Thus, V1=A.(Vh−VREF)+VREF with A=1=R1/R2.

When switch 82 closes, then capacitor 84 charges until VSAMP=V1. Signal VOSC is then close to its maximum value before the discharge on the falling edge of signal SYNC. Then, I'0=A.(VREF−Vh)/R. The system converges towards Vh=VREF, which then practically corresponds to the maximum value reached by signal VOSC, with this signal VOSC then oscillating between VMIN and VREF at a frequency f=1/T which is the recurrence frequency of the received vertical synchronization pulses. Signal NOSYNCHRO allows the potential VREF to be applied to the input of amplifier 88, typically in the absence of a synchronization signal to be processed. Then, IOSC=I0, and circuit 2 then provides a signal VOSC with a so-called free frequency, the value of which is given by the value of current I0. It will be assumed that the free frequency is imposed via switch 86 when signal NOSYNCHRO is in a first state (for example, the high state) and that this switch 86 is open when signal NOSYNCHRO is in a second state (for example the low state).

Consider the accuracy of circuit 12 illustrated in FIG. 2. It can be shown that:

dVSAMP=−R.dIOSC=−R.Cosc.VOSC.dF and dVh=−R.dIOSC/A=−R.Cosc.VOSC.dF/A

If a frequency range extending from 50 hertz to 165 hertz is considered (which example typically corresponds to the vertical scanning frequencies in the field of monitors), then dF=165−50=115 Hz. With R=18 kΩ, Cosc=150 nF, VOSC= 3V and A=20, then dVSAMP=920.10$^{-3}$V and dVh=45.10$^{-3}$V.

With VREF=5V, it can be seen that Vh varies between: VREF$-27.10^{-3}$V and VREF$+18.10^{-3}$V.

SUMMARY OF THE INVENTION

An aim of the present invention is to provide a device for detecting the locking of an automatic gain control circuit, this device taking into account the error induced by the automatic gain control circuit. Thus, the on-screen display can be adapted to the operation of circuits for processing synchronization signals. When the gain control circuit is not locked, that is, as long as the processing circuit is not synchronous with the received synchronization signals and the display is unstable, a black screen could for example be displayed, which improves the visual comfort of the user.

Thus, the present invention provides a device for detecting the locking of an automatic gain control circuit, the automatic gain control circuit receiving a signal to be regulated, a check signal and a sampling control signal for driving the operation of the circuit, this automatic gain control circuit operating so that the signal to be regulated becomes equal to the check signal when the control signal switches from a first state to a second state. The detection device includes a comparator receiving the check signal and the signal to be regulated or a signal representative of the signal to be regulated. This comparator generates two output logic signals, the states of which form a specific combination of logic states when the value of the signal to be regulated is in a range of values including the value of the check signal. The device includes a logic comparing means for recognizing the specific combination of logic states and generating a logic comparison signal, the state of which is representative of the presence or absence of this specific combination, and a storage means for storing the state of the signal generated by the logic comparing means, this storage means being driven by the sampling control signal.

BRIEF DESCRIPTION OF THE DRAWINGS

Other advantages and characteristics of the present invention will appear from the following non-limiting description of examples of implementation of the present invention, taken in conjunction with the accompanying drawings, among which.

DETAILED DESCRIPTION

Figure 1:
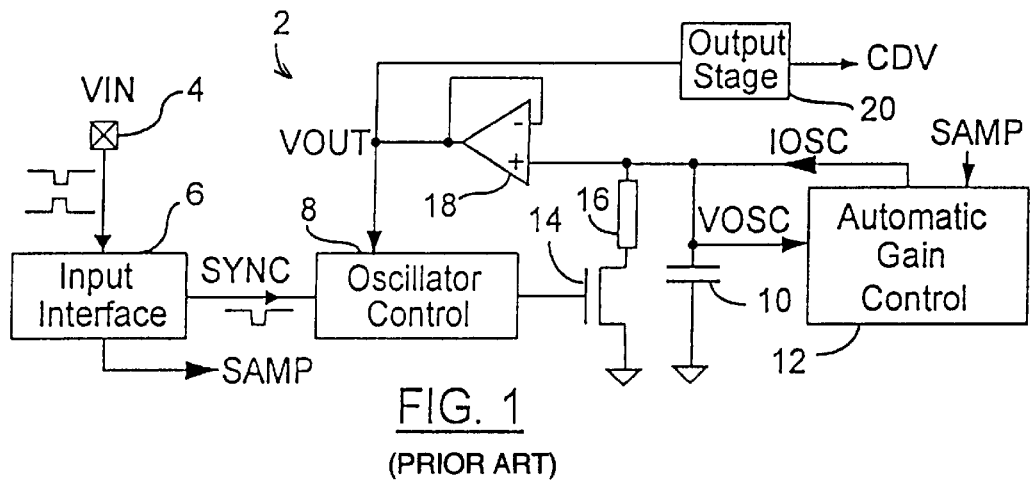
FIG. 1 schematically shows a circuit for processing a vertical synchronization signal.
Figure 2:
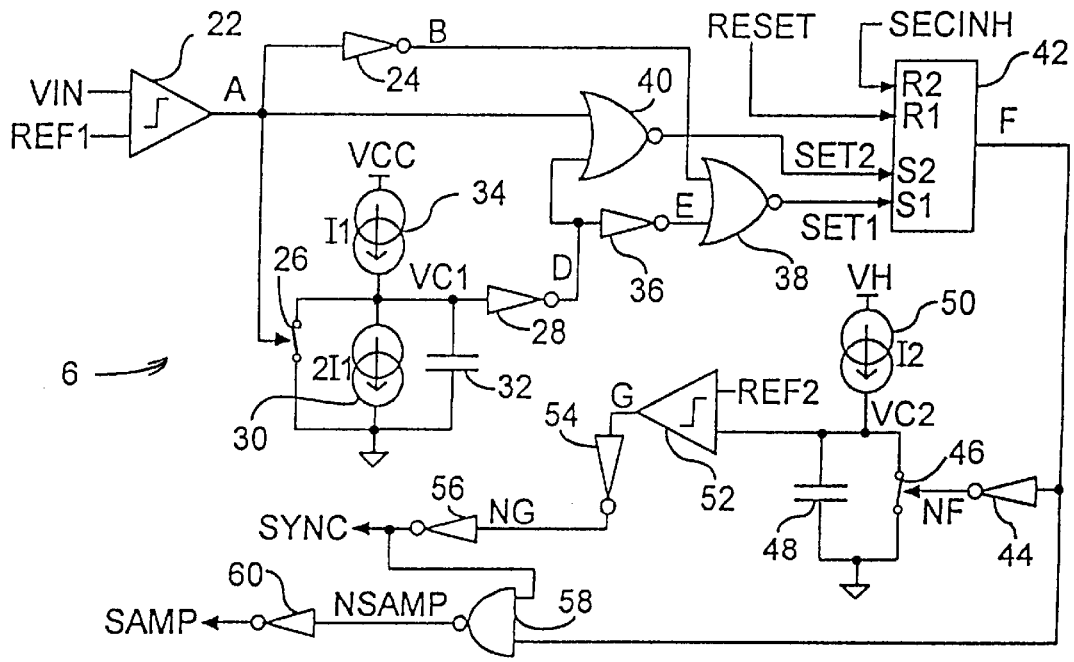
FIG. 2 shows an input interface circuit implemented in the circuit of FIG. 1.
Figure 3:
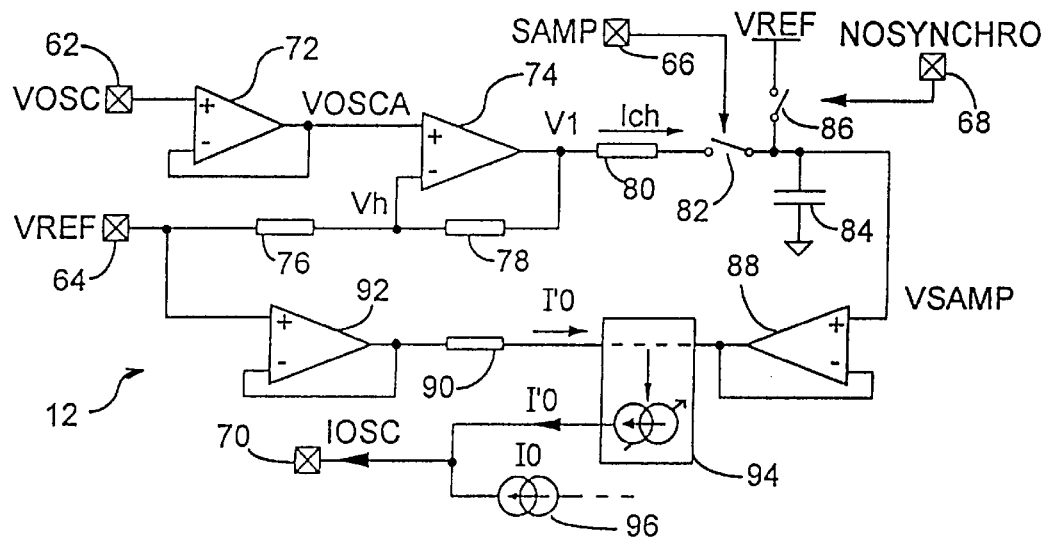
FIG. 3 shows an automatic gain control circuit implemented in the circuit of FIG. 1.
Figure 4:
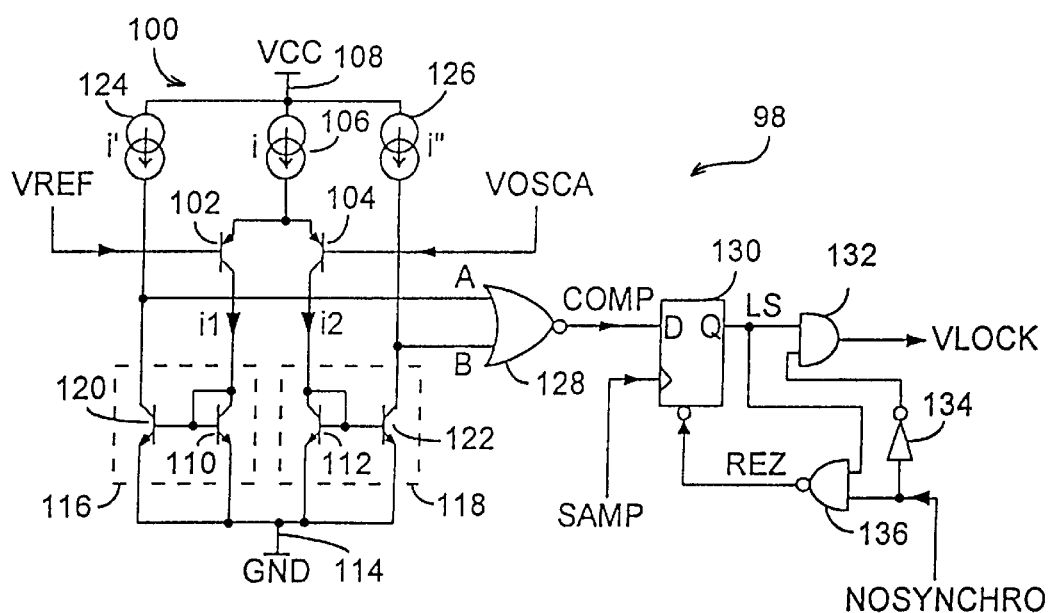
FIG. 4 shows a device for detecting the locking of an automatic gain control circuit according to the present invention.

FIG. 4 shows a device 98 for detecting the locking of an automatic gain control circuit according to the present invention.

The present invention provides a comparison of the levels of the signal VOSC to be regulated and of reference signal VREF. This comparison is taken into account at the sampling, that is, at the time when the signal to be regulated and the check signal are desired to have the same level. The 45 millivolt variation of signal Vh must be taken into account. For this purpose, a comparator having a so-called dead linear band higher than this value is used. It is provided to use a dead band higher than twice the so-called thermal voltage $V_T=26.10^{-3}$V at 300 °K of transistors. This amounts to choosing a dead band of 52 millivolts around VREF.

Locking detection circuit 98 includes a comparator 100 receiving signals VREF and VOSCA as inputs and providing two signals referred to as A and B as outputs. Signal VOSC may be used as an input instead of signal VOSCA. The advantage of using signal VOSCA at the input of the detection device is to cause no disturbance of signal VOSC. An impedance adaptation means (such as an amplifier mounted as a follower) may be used, if necessary, in the detection device.

Signals VREF and VOSCA are respectively supplied to two PNP-type bipolar transistors 102 and 104 which receive them on their respective bases. The emitters of these transistors are interconnected. A current source 106 is mounted between a high supply terminal 108 (receiving a positive potential VCC) and the emitters. It supplies a current i to the transistors. The collectors of transistors 102 and 104 provide, respectively, a current i1 and a current i2.

The collectors of transistors 102 and 104 are respectively connected to the collector of an NPN-type bipolar transistor 110 and to the collector of an NPN-type bipolar transistor 112. Transistors 110 and 112 have their respective collector connected to their base. Their emitters are connected to a reference terminal 114 or ground. Transistors 110 and 112 form the reference transistors of two current mirrors 116 and 118. An NPN-type bipolar transistor 120 forms mirror 116 with transistor 110. Transistor 120 is used as a copying transistor. An NPN-type bipolar transistor 122 forms mirror 118 with transistor 112. Transistor 122 is used as a copying transistor. The base of transistor 120 is connected to the base of transistor 110. Its emitter is connected to reference terminal 114. Its collector is connected to supply terminal 108 via a current source 124 which supplies it with a current i'. The base of transistor 122 is connected to the base of transistor 112. Its emitter is connected to reference terminal 114. Its collector is connected to supply terminal 108 via a current source 126 which supplies it with a current i". i' and i" are chosen to be lower than i/2 so that transistors 120 and 122 are saturated or blocked. In the example, i"=i'.

Signals A and B provided by comparator 100 are the signals respectively present on the collectors of transistors 120 and 122.

A two-input NOR-type logic gate 128 receives signals A and B on its two inputs. The output of gate 128 provides a signal COMP.

A latch 130 receives signal COMP on its D input. Its set input receives signal SAMP. Its reset input receives a logic control signal REZ. Non-inverting input Q of latch 130 provides a logic signal LS.

Signal REZ is supplied by a two-input AND-type logic gate 136 which receives on its inputs signals NOSYNCHRO and LS. Signal NOSYNCHRO is inverted in an inverter 134. The signal generated by this inverter and signal LS are provided to two inputs of a two-input AND-type logic gate 132. This gate provides a logic signal VLOCK representative of the locking or not of the gain loop.

The operation of the circuit will now be described.

Signal A is in the low logic state when i1=I, that is, when VOSCA is higher than VREF+2.Vt. Otherwise, it is in the high logic state.

Signal B is in the low logic state when i2=I, that is, when VOSCA is lower than VREF−2.Vt. Otherwise, it is in the high logic state.

At the output of gate 128, signal COMP is in the high logic state when VOSCA is between VREF−2.Vt and VREF+2.Vt, and it is in the low logic state otherwise. Signal COMP is taken into account at the sampling, in the automatic gain control circuit, of the value of the signal to be regulated.

When signal NOSYNCHRO is in the high state (representative of an operation imposed to the gain control circuit), signal VLOCK is maintained in the low state, representative of an absence of locking (the inverse convention may be chosen). If signal LS simultaneously is in the high state, representative of a locking, then gate 136 provides a falling edge in signal REZ to reset the content of latch 130 accordingly. Signal LS then switches to the low state.

When signal NOSYNCHRO is in the low state, the state of signal VLOCK reproduces the state of signal LS. If the automatic gain control circuit is locked, signal COMP is in the high state. Otherwise, signal COMP is in the low state. When a rising edge occurs in sampling control circuit SAMP, the state of signal COMP is sampled in latch 130, and this state is reproduced on the Q output of this latch, in signal LS. If the automatic gain control circuit is locked, signal VLOCK then switches to, or is maintained in, the high state. If the circuit is not locked, signal VLOCK is maintained in, or switches to, the low state.

Signal SECINH may be taken into account to generate signal REZ and set latch 130 at the starting. For this purpose, signal REZ will for example be generated by combining in an AND logic gate the signal generated by gate 136 and signal SECINH.

Of course, the polarity of the described signals may for example be inverted, or the nature of the logic gates generating these signals may be changed, without leaving the field of the invention.

The present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for detecting locking of an automatic gain control circuit, the automatic gain control circuit receiving a signal to be regulated, a check signal and a sampling control signal for driving the operation of the circuit, the automatic gain control circuit operating so that the signal to be regulated becomes equal to the check signal when the control signal switches from a first state to a second state, comprising:

a comparator receiving the check signal and the signal to be regulated or a signal representative of the signal to be regulated, the comparator generating two output logic signals the states of which form a specific combination of logic states when the value of the signal to be regulated is in a range of values including the value of the check signal, a logic comparing means for recognizing the specific combination of logic states and generating a logic comparison signal, the state of which is representative of the presence or absence of this specific combination, and a storage means for storing the state of the signal generated by the logic comparing means, the storage means being driven by the sampling control signal.

2. A device according to claim 1, wherein the comparator includes two input transistors controlled on the one hand by the check signal, and on the other hand by the signal to be regulated or the signal representative of this signal to be regulated, a first current source for supplying the input transistors, two output transistors controlled according to a current running through the input transistors, and a second and third current sources for supplying the output transistors, these second and third current sources being capable of supplying a current lower than half the current supplied by the first current source.

3. A device according to claim 1, wherein the storage means is a latch.

4. A device according to claim 1 wherein said comparator comprises first and second input transistors and a first current source for supplying said first and second transistors.

5. A device according to claim 4 wherein said first input transistor receives and is controlled by said check signal.

6. A device according to claim 5 wherein said second input transistor receives and is controlled by said regulated signal.

7. A device according to claim 6 wherein both said first and second input transistors are bipolar transistors.

8. A device according to claim 7 wherein each said bipolar transistor is a PNP-type bipolar transistor.

9. A device according to claim 8 wherein the emitters of the bipolar transistors are interconnected and coupled to said first current source.

10. A device according to claim 9 wherein the check and regulated signals are coupled to the base of respective first and second bipolar transistors.

11. A device according to claim 6 wherein said comparator further comprises first and second output transistors coupled respectively to and controlled by the current through said first and second input transistors.

12. A device according to claim 11 wherein said comparator further comprises second and third current sources for supplying respective first and second output transistors.

13. A device according to claim 12 wherein said second and third current sources are coupled to supply a current lower than half the current provided by the first current source.

14. A device according to claim 13 wherein both said first and second output transistors are bipolar transistors.

15. A device according to claim 14 wherein each said output bipolar transistor is an NPN-type bipolar transistor.

16. A device according to claim 15 wherein the collectors of the input bipolar transistors connected to respective collectors of the output bipolar transistors.

17. A device according to claim 16 wherein said first and second output transistors form part of respective first and second current mirrors.

18. A device according to claim 17 wherein each current mirror includes respective third and fourth transistors.

19. A device according to claim 18 wherein the two output logic signals are taken at respective collectors of the third and fourth transistors.

20. A device according to claim 19 wherein said logic comparing means comprises a logic gate.

21. A device according to claim 20 wherein said logic gate is a NOR gate.

22. A device according to claim 21 wherein said storage means comprises a latch.

23. A device for detecting locking of an automatic gain control circuit, the automatic gain control circuit receiving a signal to be regulated, a check signal and a sampling control signal for driving the operation of the circuit, the automatic gain control circuit operating so that the signal to be regulated becomes equal to the check signal when the control signal switches from a first state to a second state, comprising:

a first circuit for receiving the check signal and the signal to be regulated, and for providing two output logic signals the states of which form a specific combination of logic states when the value of the signal to be regulated is in a range of values including the value of the check signal, a second circuit for recognizing the specific combination of logic states and generating a logic comparison signal, the state of which is representative of the presence or absence of this specific combination, and a third circuit for storing the state of the signal generated by the second circuit, said third circuit being driven by the sampling control signal.

24. A device according to claim 23 wherein said first circuit comprises a comparator including first and second input transistors and a first current source for supplying said first and second transistors.

25. A device according to claim 24 wherein said first input transistor receives and is controlled by said check signal.

26. A device according to claim 25 wherein said second input transistor receives and is controlled by said regulated signal.

27. A device according to claim 26 wherein both said first and second input transistors are bipolar transistors.

28. A device according to claim 27 wherein each said bipolar transistor is a PNP-type bipolar transistor.

29. A device according to claim 28 wherein the emitters of the bipolar transistors are interconnected and coupled to said first current source.

30. A device according to claim 29 wherein the check and regulated signals are coupled to the base of respective first and second bipolar transistors.

31. A device according to claim 26 wherein said comparator further comprises first and second output transistors coupled respectively to and controlled by the current through said first and second input transistors.

32. A device according to claim 31 wherein said comparator further comprises second and third current sources for supplying respective first and second output transistors.

33. A device according to claim 32 wherein said second and third current sources are coupled to supply a current lower than half the current provided by the first current source.

34. A device according to claim 33 wherein both said first and second output transistors are bipolar transistors.

35. A device according to claim 34 wherein each said output bipolar transistor is an NPN-type bipolar transistor.

36. A device according to claim 35 wherein the collectors of the input bipolar transistors connected to respective collectors of the output bipolar transistors.

37. A device according to claim 36 wherein said first and second output transistors form part of respective first and second current mirrors.

38. A device according to claim 37 wherein each current mirror includes respective third and fourth transistors.

39. A device according to claim 38 wherein the two output logic signals are taken at respective collectors of the third and fourth transistors.

40. A device according to claim 39 wherein said logic comparing means comprises a logic gate.

41. A device according to claim 40 wherein said logic gate is a NOR gate.

42. A device according to claim 41 wherein said storage means comprises a latch.

* * * * *